(12) United States Patent
Ahlquist et al.

(10) Patent No.: US 6,560,735 B1
(45) Date of Patent: May 6, 2003

(54) METHODS AND APPARATUS FOR TESTING INTEGRATED CIRCUITS

(75) Inventors: Louis Nelson Ahlquist, Annandale, NJ (US); Yinon Degani, Highland Park, NJ (US); Jericho J. Jacala, Murray Hill, NJ (US); Dean Paul Kossives, Glen Gardner, NJ (US); King Lien Tai, Berkeley Heights, NJ (US)

(73) Assignee: Agere Systems Inc, Allentown, PA (US)

( * ) Notice: Subject to any disclaimer, the term of this patent is extended or adjusted under 35 U.S.C. 154(b) by 0 days.

(21) Appl. No.: 09/366,388

(22) Filed: Aug. 3, 1999

(51) Int. Cl.$^7$ ................................................. G01R 31/28
(52) U.S. Cl. ........................................ 714/724; 324/538
(58) Field of Search ................................ 324/758, 757, 324/754, 755, 538; 438/15; 714/724, 734, 742; 257/738

(56) References Cited

U.S. PATENT DOCUMENTS

| | | | | |
|---|---|---|---|---|
| 4,288,808 A | * | 9/1981 | Hantusch | 257/738 |
| 5,479,105 A | * | 12/1995 | Kim et al. | 324/755 |
| 5,523,696 A | * | 6/1996 | Charlton et al. | 324/758 |
| 5,528,159 A | * | 6/1996 | Charlton et al. | 324/758 |
| 5,568,057 A | * | 10/1996 | Kim et al. | 324/755 |
| 5,581,195 A | * | 12/1996 | Lee et al. | 324/755 |
| 5,880,590 A | * | 3/1999 | Desai et al. | 324/757 |
| 5,940,680 A | * | 8/1999 | Lee et al. | 438/15 |
| 5,983,492 A | * | 11/1999 | Fjelstad | 29/843 |
| 5,990,692 A | * | 11/1999 | Jeong et al. | 324/755 |
| 6,037,786 A | * | 3/2000 | Palagonia | 324/754 |
| 6,188,231 B1 | * | 2/2001 | Palagonia | 324/754 |
| 6,229,320 B1 | * | 5/2001 | Haseyama et al. | 324/754 |
| 6,262,581 B1 | * | 7/2001 | Han | 324/755 |

* cited by examiner

Primary Examiner—David Ton
(74) Attorney, Agent, or Firm—Peter V. D. Wilde

(57) ABSTRACT

The specification describes an IC test apparatus having a test bed with sockets adapted to engage arrays of I/O solder balls/bumps on the IC chip. In one embodiment the sockets are provided with through holes to interconnect the solder bumps to the next board level with minimum electrical path length thereby reducing parasitic capacitive coupling. In another embodiment the sockets in the test bed are formed by intersecting V-grooves. If pairs of intersecting V-grooves are used, pyramid shaped features are produced at the bottom of each socket. Both the sharp edges formed by the intersecting V-grooves and the pyramid provide contact enhancement between the solder bumps and the test bed. The test bed can be made as a universal blank for a given solder bump pitch. The desired test circuit is formed at the next board level.

14 Claims, 6 Drawing Sheets

METHODS AND APPARATUS FOR TESTING INTEGRATED CIRCUITS

FIELD OF THE INVENTION

This invention relates to methods and apparatus for testing semiconductor integrated circuits (IC) devices, and more specifically to testers for solder bump IC devices.

BACKGROUND OF THE INVENTION

Testing of semiconductor devices is typically conducted with apparatus constructed on the "bed of nails" principle. This type of test equipment is highly developed and widely used. However, as the pitch of IC devices shrinks, it becomes difficult to reliably access the contact pads on the IC device. The difficulty is not only accessing a small array of contacts, but the contact resistance varies significantly from pin to pin, and is sometimes excessive. Improvements in test equipment for solder bump arrays have been made. One example is the use of a silicon test bed in which a pattern of recesses is etched into a silicon wafer, and each recess is interconnected to a test circuit that simulates the device circuit. The array of recesses is matched to the solder ball array on the IC device. The use of silicon as the test bed offers the advantages of high planarity, thermal properties that match the IC substrate, notably coefficient of thermal expansion, and the availability of a well developed interconnect technology for fabricating the test circuit.

In spite of this advance, further improvements IC testing apparatus are continually being sought. In particular, improving the reliability of electrical contact over the large array of solder bumps is a primary goal. Although the bump arrays in state of the art solder bump devices are relatively uniform, small variations in bump size and bump height are typical. Small variations in the etched recesses also occur. As a result, all of the bumps do not effectively contact the recesses in the test array when the IC chip is aligned to the array. It is necessary to apply a large axial force to the IC chip to cause the bump or bumps in the "high" spots of the bump array to deform sufficiently so that the bumps in the low spots adequately contact the test array. The force required to effect this, even in high precision advanced IC packages, is frequently near the breaking point of the IC substrate. This is a special concern for testing devices at the wafer level, where high stress on the wafer may cause fracture or other problems.

STATEMENT OF THE INVENTION

We have developed a test apparatus for either singulated IC devices or wafers that greatly reduces the pressure required to bring all bumps in the IC array into contact with the test array. The test apparatus of the invention has a flat test bed with an array of sockets arranged to receive the array of IC solder balls, and the sockets in the flat test bed test are provided with re-entrant sidewalls so that, in contrast with the flat or dished shape surfaces of prior art recesses, the sockets have sharp edges that contact the solder bump array. As a result the deformation required to bring all solder bumps in the array into firm contact with the test array surfaces is sharply reduced, and the force required to effect the deformation is correspondingly reduced. In the preferred embodiments the re-entrant features in the sockets are formed by intersecting grooves in the surface of the flat bed. When pairs of parallel V-grooves are used, and the grooves made to overlap, then one or more pyramids form at the intersections of pairs of grooves. The point of the pyramid at the bottom of the socket becomes a main bearing feature to provide reliable electrical contact.

DETAILED DESCRIPTION

Figure 1:
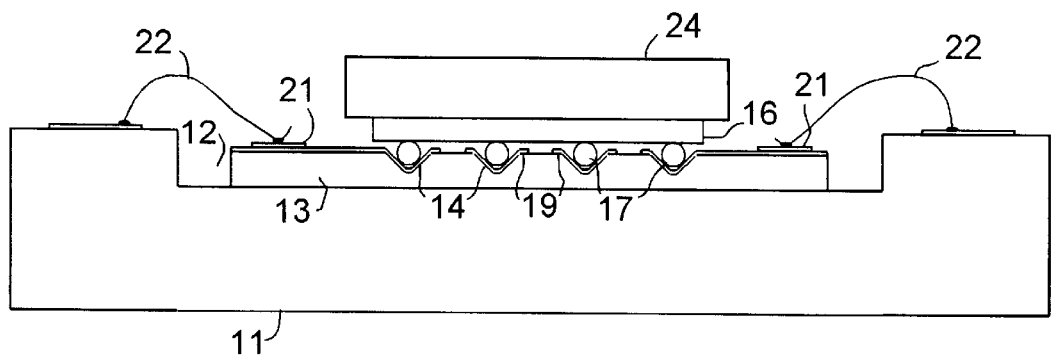
FIG. 1 is a schematic view of a solder bump device under test in a prior art silicon wafer test bed apparatus.

Referring to FIG. 1 a conventional silicon wafer bed test apparatus is shown with base 11, and recess 12 in the base for supporting silicon wafer test bed 13. The silicon wafer is provided with an array of sockets 14 for receiving the solder bumps on the device under test. A typical solder bumped IC chip is shown at 16, inverted to mate the array of solder bumps 17 with the sockets 14. Printed interconnections 19 are formed on the upper surface of the silicon wafer interconnecting the sockets 14 with bonding pads 21. The bonding pads are wire bonded to the base member with wire bonds 22 to interconnect the IC to a test circuit (not shown). It will be understood by those skilled in the art that, for simplicity in illustration, only a few solder bumps are shown in these figures. Typically there will be dozens or even hundreds of solder bumps to be interconnected for test.

The pitch of contact pads for a bumped IC chip in current technology is of the order of 50–900 $\mu$m and the spacing between pads may be 20–500 $\mu$m. The bumps are typically 15–150 $\mu$m in height (z-direction). The device package is usually square or rectangular with sides typically in the 2–50 mil range.

The IC device to be tested is mounted in place on the test bed by aligning the solder bumps array with the sockets in the test bed. The placing of the IC device on the test bed is accomplished with a pick and place alignment tool. Once placed in proper alignment, the IC device is held in place for testing by block 24, which is also used to apply pressure uniformly to the IC and ensure contact between solder bumps 17 and sockets 14 over the entire array.

Figure 2:
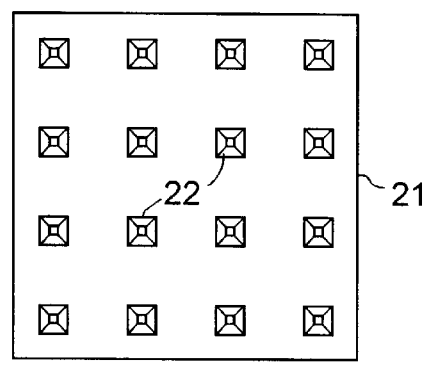
FIG. 2 is a plan view of the array of sockets in the test bed of FIG. 1.

The array of sockets 14 in FIG. 1 is shown in plan view in FIG. 2. Here sockets 22 are formed typically in the silicon wafer test bed 21 by etching. Photolithography can be used to form precisely spaced arrays with matching socket geometries. In FIG. 2, the sockets have the shape of an inverted truncated pyramid.

Figure 3:
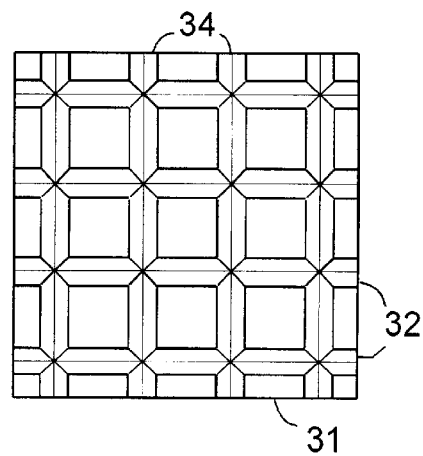
FIG. 3 is a view similar to that of FIG. 2 of an array of test bed recesses according to the invention showing the simplest embodiment of re-entrant features.
Figure 4:
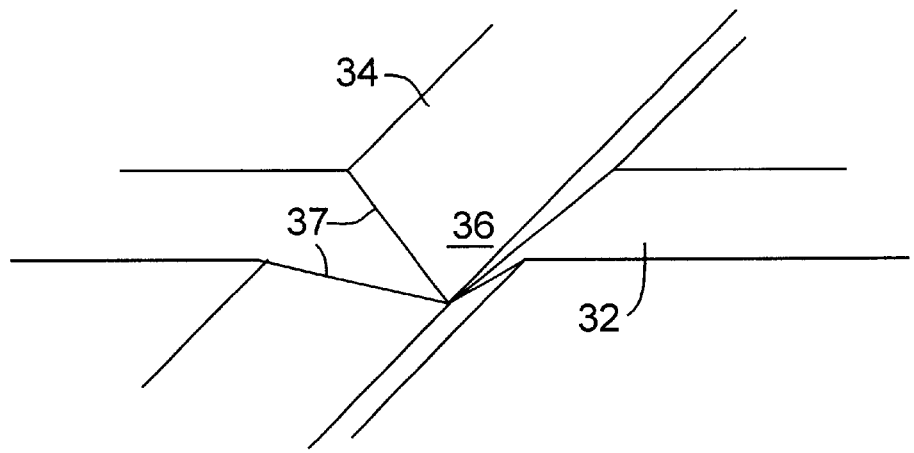
FIG. 4 is a view showing the sockets of FIG. 3 in more detail.

An improved test apparatus according to the invention is shown in FIG. 3. The test bed is grooved in orthogonal directions to form sockets at the intersection of the grooves. In FIG. 3, the test bed 31 is shown with grooves 32 extending in the x-direction, and grooves 34 extending in the y-direction. The socket formed by intersecting grooves can be seen in more detail in FIG. 4, which is a cutaway portion of the test bed of FIG. 3, showing a single socket. The V-groove 32 intersects V-groove 34 forming socket 36 which comprises essentially the four edges 37. These edges are relatively sharp and make effective contact with spherical bodies, e.g. solder bumps, placed in the socket.

The material of the test bed is preferably hard, e.g. ceramic or silicon. The V-grooves may be formed by any suitable technique. In the case of ceramic, the V-grooves are preferably formed using a conventional dicing saw apparatus with a V-shaped blade. In the case of silicon, the V-groove may be etched, using photolithography to selectively etch the grooves where desired. However, the preferred choice in the case of silicon is to cut the grooves using a dicing tool as just mentioned. The shape of the groove can be varied. An essentially pure V-groove is relatively simple to construct. Alternatively, grooves with a flattened bottom may be formed using a saw blade with an inverted truncated pyramid. This option may be especially useful where the test bed is provided with through holes as will be described later.

The socket formed at the intersection of the orthogonal V-grooves is plated with metal, and the array of sockets is interconnected with a printed circuit in a suitable manner, e.g. as described in connection with FIG. 1. Where a silicon wafer is used as the test bed, the V-grooves are provided with an oxide or other insulating coating prior to plating the sockets. The term plating is used here to describe any selective area deposition technique. The insulating layer is preferably formed by growing or depositing $SiO_2$. A suitable processing sequence for silicon wafer test beds is:

1. Saw intersecting V-grooves using a dicing saw.
2. Grow a layer of oxide with a thickness of, e.g. 0.25–1.5 $\mu$m oxide on the grooved substrate and extending into the V-grooves.
3. Blanket deposit a conductive metal layer on the wafer.
4. Selectively etch the conductive metal layer to leave an interconnect pattern on the silicon wafer test bed and coat the sockets formed at the intersection of the V-grooves.

The metal used in step 3 may be aluminum but is preferably a hard metal such as Ni, Au or Au-Pd so that the edges of the socket remain sharp. The metal may cover the entire socket, or part of the socket as long as one or more edges are covered.

The sockets are preferably formed at the intersection of orthogonal grooves. However, useful sockets with appropriately sharp edges can be formed with grooves intersecting at angles other than 90°. Useful sockets may also be formed using more than two intersecting grooves, i.e. multiple grooves intersecting at different angles. This expedient can produce star shapes in which the socket may comprise six or eight contact edges. The shape of the groove may also be varied. V-grooves are convenient to produce, but other groove shapes, even rectangular grooves, may be found useful. The preferred groove angle as measured from wall to wall is 90°+/−30°. The depth of the groove should be at least 30%, and preferably at least 40% of the diameter of the solder bumps on the IC devices inserted into the test bed.

An alternative procedure for forming the V-grooved test bed using a single crystal silicon wafer is the following:

1. Grow an oxide layer 0.25–1.5 $\mu$m on the Si wafer.
2. Lithographically form a V-groove mask on the oxide, preferably by applying and patterning a photoresist layer.
3. Etch the oxide with a standard HF etch to leave the desired V-groove pattern on the silicon wafer.
4. Etch the exposed silicon using a crystallographic etch, e.g. 20% NaOH in water, to etch the silicon wafer along crystallographic planes that intersect in a V, thus producing V-grooves in the V-groove pattern of step 3.
5. Regrow oxide on the exposed silicon in the V-grooves.
6. Blanket deposit a conductive metal layer on the wafer.
7. Selectively etch the conductive metal layer to leave an interconnect pattern on the silicon wafer test bed and coat the sockets formed at the intersection of the V-grooves.

Another option according to the invention is to use a polysilicon wafer as the test bed material. A suitable process sequence is:

1. Grow an oxide layer 0.25 to 1.5 $\mu$m on the polysilicon wafer.
2. Lithographically form a V-groove mask on the oxide, preferably by applying and patterning a photoresist layer.
3. Etch the oxide with a standard HF etch to leave the desired V-groove pattern on the silicon wafer.
4. Etch the exposed silicon using an isotropic etch, e.g. 20% NaOH in water, to etch the silicon wafer and undercut the mask, thus producing V-grooves in the V-groove pattern of step 3.
5. Regrow oxide on the exposed silicon in the V-grooves.
6. Blanket deposit a conductive metal layer on the wafer.
7. Selectively etch the conductive metal layer to leave an interconnect pattern on the silicon wafer test bed and on the sockets formed at the intersection of the V-grooves.

Suitable grooved structures can also be produced in both polysilicon and single crystal silicon using a photoresist mask for the V-groove etch step.

Figure 5:
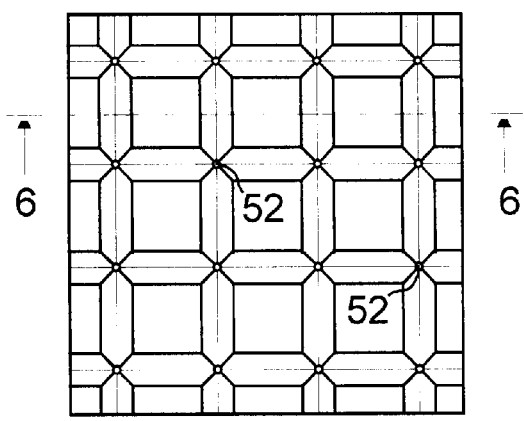
FIGS. 5 and 6 show alternative of test bed designs according to the invention.
Figure 6:
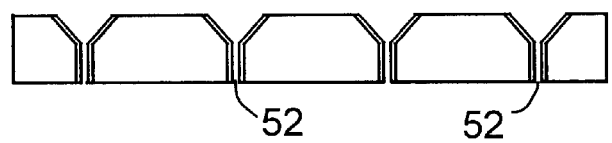

A preferred embodiment of the invention with a highly efficient interconnect strategy is shown in FIGS. 5 and 6. With reference to FIG. 5, the sockets formed by intersecting grooves are provide with through hole interconnections 52. The test bed is shown in cross section in FIG. 6, which is a section through 6—6 of FIG. 5. The through hole interconnections allow the test signals from the solder bumps on the IC under test to flow directly through the test bed to the test circuit on the next board level, thereby substantially reducing parasitics in the test signals.

Through holes may be provided in ceramic test beds in the conventional manner by drilling the ceramic and through plating the holes. Through holes in ceramic may also be formed using co-fired ceramic. This known technique allows the holes to be accurately formed and plated with, e.g., tungsten plugs, in the co-firing operation. Through holes may be provided in silicon wafers by known methods such as laser drilling the holes, oxidizing the holes and depositing metal on the oxide. A suitable technique for forming the conductor material in the through holes is by metal sputtering or electroless plating.

Figure 7:
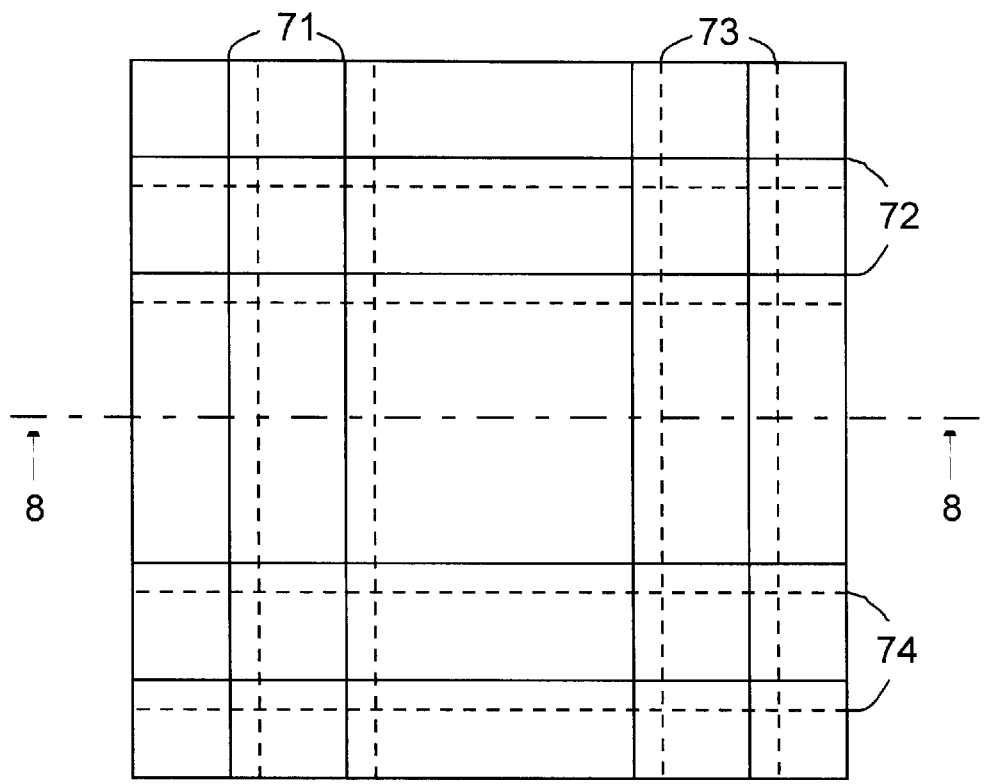
FIGS. 7–9 show a preferred embodiment of an array of test sockets according to the invention using pairs of overlapping grooves.
Figure 8:
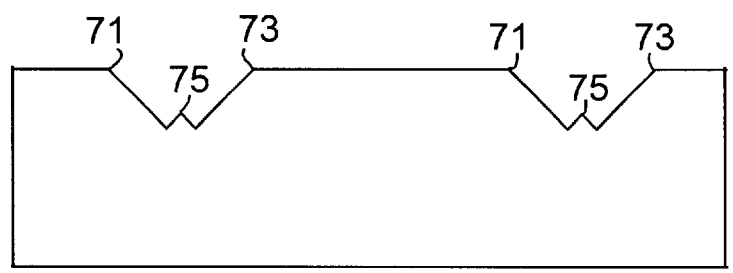
Figure 9:
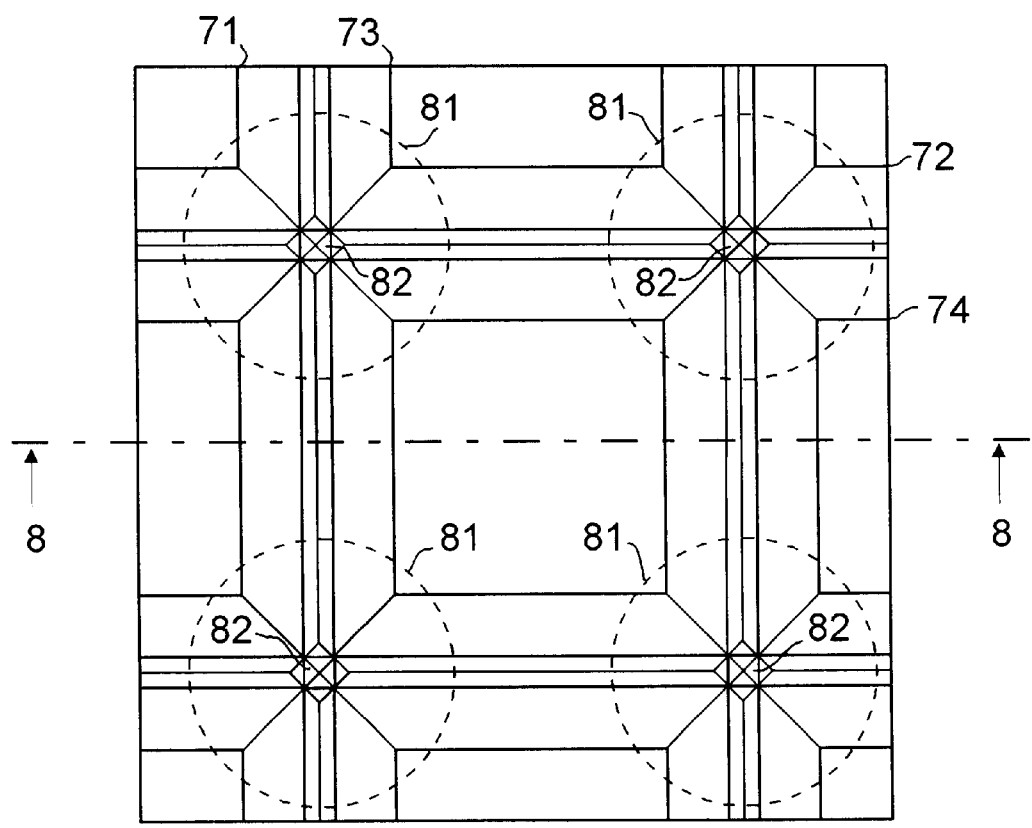

Another preferred embodiment of the invention is shown in FIGS. 7–9. Here pairs of parallel grooves are used to form sharp contact surfaces in the bottom of the socket. Referring to FIG. 7, the boundaries of a first set of y-direction grooves are indicated at 71, and the boundaries of a first set of x-direction grooves are indicated at 72. The second set of grooves is shown with dashed lines in FIG. 7. The second set of grooves is made overlapping the first set. The boundaries of a second set of y-direction grooves are indicated at 73 and the boundaries of a second set of x-direction grooves are indicated at 74. After the grooves are formed, the profile of the test bed with overlapping pairs of V-grooves is shown in FIG. 8, which is a section through 8—8 of FIG. 7. The boundaries 71 and 73 remain after the overlapping grooves are formed. At the bottom of the overlapping pair of grooves a ridge 75 forms. The height of the ridge as a percentage of the depth of the groove is equal to percentage overlap of the pair of grooves. It is preferred that this percentage be in the range 5–40%. The profile of FIG. 8 shows only the y-direction grooves. FIG. 9 shows the boundaries of both sets of grooves, i.e. 71 and 73 of the y-direction grooves and 72 and 74 of the x-direction grooves. The sockets are shown at 81 and each socket has a pyramid 82 formed in the bottom of the socket. This pyramid has a sharp top which, as discussed earlier, presents an effective contact point to enhance the electrical contact of the socket.

When silicon wafers are grooved according to the invention and the grooves are relatively deep the wafers may tend to fracture along the groove line. Accordingly, it may be desirable, prior to the grooving step, to laminate the wafers to another substrate, e.g. ceramic, or add another silicon wafer as a laminate. The wafer can be laminated using a conventional organic adhesive.

Figure 10:
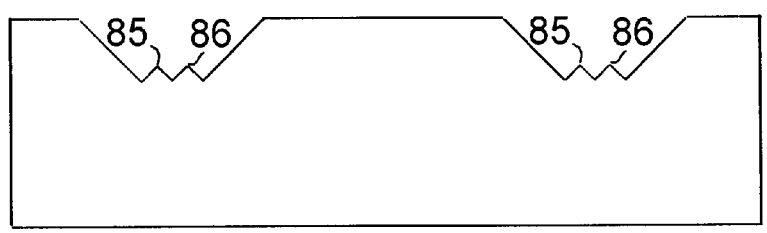
FIG. 10 shows a cross section of a test bed with sockets formed at the intersections of sets having three grooves.

Having shown the effect of overlapping a pair of grooves, it will occur to those skilled in the art that more than two parallel grooves can be used to form the sockets. FIG. 10 shows a cross section of a test bed in which three overlapping parallel grooves are used in each groove set. In this case two ridges, 85 and 86, form at the bottom of the groove set. At the intersection of two sets of three parallel grooves, a set of four pyramids will form. In this case the points of the four pyramids may provide sufficient contact for the socket that they can be employed as the primary contact surfaces for the solder bumps. In this case the space between the edges of the socket is relatively unimportant, and the socket array can be used for different sized solder balls, as long as the pitch of the solder ball array is the same.

Figure 11:
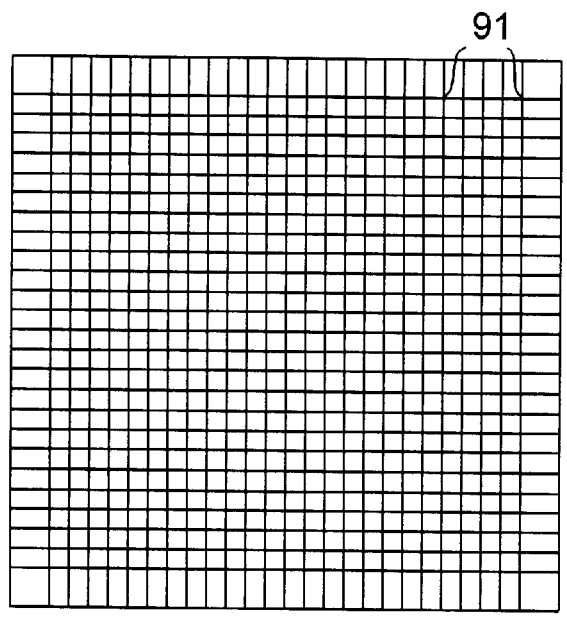
FIGS. 11 and 12 are schematic representations of a universal test bed according to the invention.
Figure 12:
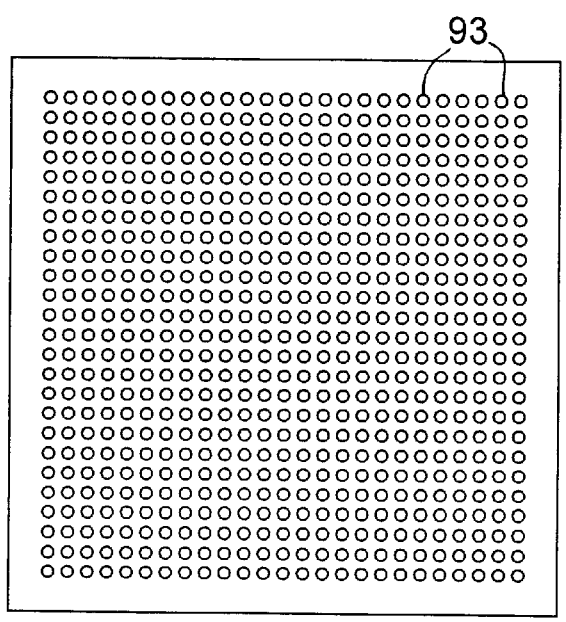

A universal test bed can be constructed using the principles described above by providing an array of solder ball sockets on one side of the test bed, and an array of interconnection sites on the other side of the test bed. A key ingredient of this approach is the use of plated through holes as described in connection with FIGS. 5 and 6. The interconnection array is adapted to be interconnected to the next board level, e.g. a silicon, ceramic, or epoxy interconnection substrate. The interconnection circuit at the next board level is tailored to the IC to be tested. Sockets and interconnection sites on the universal test bed that are not interconnected remain but are not used. A test bed with a "blank" array of sockets is shown schematically in FIG. 11. Sockets 91 are formed at the intersection of the grooves as described above. The obverse side of the test bed is shown in FIG. 12. The array of interconnection sites 93 are available for interconnection in any desired configuration. The advantage of the universal test bed approach is that the socket part of the test apparatus can be made in volume at relatively low cost. A batch of universal test bed wafers can be made for each commonly used pitch, and can even be made with arrays on different pitch.

IC devices for which the test apparatus of this invention is suitable are unpackaged chips or chip scale packages with solder bump or ball grid arrays. The I/O contacts may be perimeter or area arrays in which the solder bumps/balls are raised off the IC surface, typically by more than 10 $\mu$m, to as much as 100 $\mu$m, or even 500 $\mu$m in the case of some ball grid arrays.

The step of electrically testing the IC devices according to the invention involves the application of test voltages to selected I/O sockets of the test bed through the test interconnection substrate. Thus in a typical manufacturing operation using the invention, IC devices would be conveyed from the singulation or packaging operation to a placement tool, then individually placed with the solder bumps or ball grid aligned to the socket array. The interconnection circuit used for the test can be an identical replica of the interconnection circuit on which the IC devices are permanently mounted. The test bed can also be the actual interconnection substrate to which an IC device that passes the electrical test is permanently bonded.

The description of the invention so far is largely in terms of testing singulated chips. Because of the effectiveness of the socket array for temporarily accessing large arrays of solder bumps or balls, the apparatus of the invention is suitable for wafer scale testing. As shown in FIG. 12, the test bed 94 described above is easily mounted on the head 95 of a placement tool. The placement tool head may also be provided with test circuits and passive components indicated schematically at 96 and 97. A wafer under test is shown at 98 with four solder bumps 99 representing one IC device, or a portion of an IC device, on wafer 98 prior to singulation.

Figure 13:
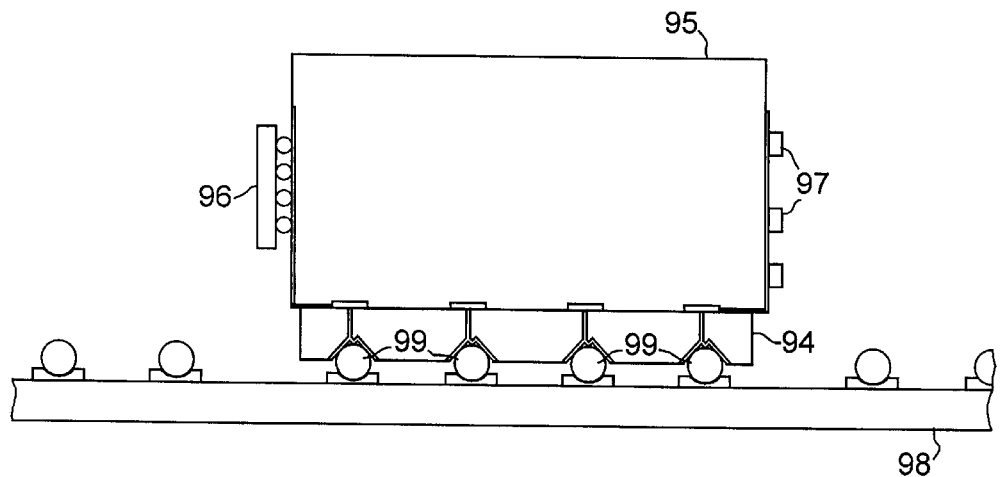
FIG. 13 is a schematic representation of the application of the test apparatus of the invention to wafer scale testing.
Figure 14:
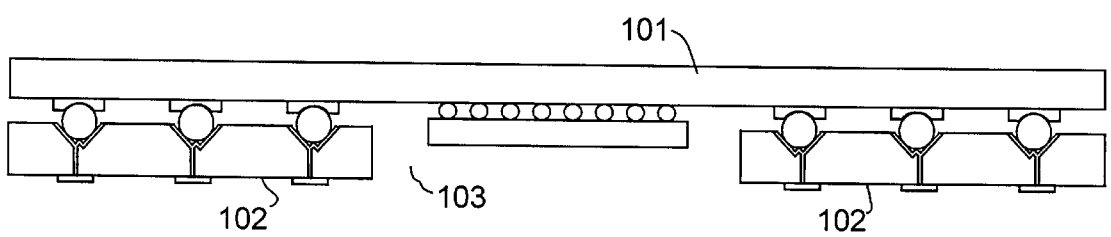
FIG. 14 is a view of a test bed apparatus of the invention adapted for multichip module packages.

The test apparatus of the invention can be used with singulated IC chips as described above, or with multi-chip modules. FIG. 13 shows a recessed chip MCM package 101 mounted for test on test bed 102. In this application the test bed is provided with an opening 103 to accommodate the recessed chip. The term IC device as used herein is intended to include packages containing one or more IC chips.

The electrical test procedure itself is conventional and comprises the steps of applying test voltages to the array of electrical test contacts, measuring the test voltages, comparing the measured test voltages to a set of predetermined IC device voltages, and selecting those IC devices with test voltages that meet said set of predetermined IC device voltages for final assembly, i.e. bonding the IC device to a permanent interconnection substrate. As will be understood by those skilled in the art the steps of measuring, comparing and selecting are carried out by automated software driven means.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A method for electrically testing an IC device, said device having an array of I/O solder bumps on at least one surface thereof the solder bumps having an approximate diameter d, the test method comprising:
   a. aligning said array of I/O solder bumps on the IC device with an array of electrical test sockets on an interconnection substrate,
   b. inserting the I/O solder bumps into said array of sockets, and
   c. applying test voltages to said array of sockets,
the method characterized in that said sockets are formed by the intersection of grooves in said interconnection substrate, the grooves having a depth of at least 30% d.

2. The method of claim 1 in which the sockets constitute pairs of orthogonal grooves.

3. The method of claim 2 in which the sockets are formed by the intersection of:
   a. at least two grooves extending in a first direction and
   b. at least two grooves extending in a second direction, and wherein said at least two grooves overlap.

4. The method of claim 3 in which the two grooves overlap by 5–40%.

5. The method of claim 1 in which the grooves intersect orthogonally.

6. The method of claim 1 in which the grooves are V-grooves.

7. A method for electrically testing an IC device, said device having an array of I/O solder bumps on at least one surface thereof, the test method comprising:
   a. aligning said array of I/O solder bumps on the IC device with an array of electrical test sockets recessed into an interconnection substrate,
   b. inserting the I/O solder bumps into said array of sockets, and
   c. applying test voltages to said array of sockets,
the method characterized in that said sockets are provided with through hole interconnections through said interconnection substrate.

8. The method of claim 7 wherein the said sockets are formed by the intersection of grooves in the interconnection substrate.

9. An electrical test apparatus comprising:
   an array of electrical test sockets said array of electrical test sockets comprising:
   i. an interconnection substrate,
   ii. a first set of grooves extending in a first direction, the grooves having a depth d,
   iii. a second set of grooves having a depth of approximately d extending in a second direction with said second set of grooves intersecting said first set of grooves to form said array of electrical test sockets at the intersections of said first grooves and said second grooves,
   iv. each electrical test socket in the array of test sockets having a metal coating covering at least a portion thereof.

10. The apparatus of claim 9 in which the first and second directions are orthogonal.

11. The apparatus of claim 10 in which each groove in said first and second set of grooves comprises at least two overlapping grooves that overlap by at least 50% and each of said array of electrical test sockets has at least one pyramid in the bottom of the socket.

12. The apparatus of claim 9 wherein the said grooves are V-grooves.

13. An electrical test apparatus comprising:
   a. an array of electrical test sockets said array of electrical test sockets comprising:
   i. an interconnection substrate having a test bed side and an interconnection side,
   ii. an array of recesses on said test bed side of said interconnection substrate,
   iii. metallization covering said recesses,
   iv. an array of bonding sites on the interconnection side of said interconnection substrate, and
   iv. through hole interconnections through said interconnection substrate interconnecting said metallization on the test bed side of the interconnection substrate and the said array of bonding sites on the interconnection side of said interconnection substrate.

14. The apparatus of claim 13 wherein the said sockets are formed by the intersection of grooves in the interconnection substrate.

* * * * *